US012627307B2

(12) United States Patent
Zhang et al.

(10) Patent No.: US 12,627,307 B2
(45) Date of Patent: May 12, 2026

(54) METHOD FOR ENHANCING CHARACTERISTIC SIGNALS BY SYNTHESIZING MULTIPLE FREQUENCY WAVES

(71) Applicants: The University of Hong Kong, Hong Kong (HK); National Center for Nanoscience and Technology, Beijing (CN)

(72) Inventors: Shuang Zhang, Hong Kong (HK); Fuxin Guan, Hong Kong (HK); Kebo Zeng, Hong Kong (HK); Qing Dai, Beijing (CN); Xiangdong Guo, Hong Kong (HK)

(73) Assignees: The University of Hong Kong, Hong Kong (HK); National Center for Nanoscience and Technology, Beijing (CN)

( * ) Notice: Subject to any disclaimer, the term of this patent is extended or adjusted under 35 U.S.C. 154(b) by 171 days.

(21) Appl. No.: 18/761,358

(22) Filed: Jul. 2, 2024

(65) Prior Publication Data

US 2025/0038753 A1     Jan. 30, 2025

(30) Foreign Application Priority Data

Jul. 4, 2023    (CN) .......................... 202310809421.8

(51) Int. Cl.
  *H03L 7/16* (2006.01)

(52) U.S. Cl.
  CPC ..................................... *H03L 7/16* (2013.01)

(58) Field of Classification Search
  CPC .. H03L 7/16; G01N 21/31; G01N 2021/3125; G01N 2201/1248; G16C 20/20
  See application file for complete search history.

(56) References Cited

U.S. PATENT DOCUMENTS 6,740,518 B1 * 5/2004 Duong ............... G01N 27/3277
                                                        435/7.1
2018/0309941 A1 * 10/2018 Lopez ................... G01J 3/2823

* cited by examiner

*Primary Examiner* — Georgia Y Epps
*Assistant Examiner* — Monica T Taba
(74) *Attorney, Agent, or Firm* — IDEA Intellectual Limited; Sam T. Yip

(57) ABSTRACT

A method for enhancing characteristic signals by synthesizing multiple frequency waves is provided, which includes: obtaining real frequency responses based on the measurement results of spectral signals; selecting complex frequencies to at least partially compensate for spectral line broadening caused by losses; and obtaining complex frequency responses based on multiple real frequency responses and the selected complex frequencies to enhance the characteristic signals.

12 Claims, 5 Drawing Sheets

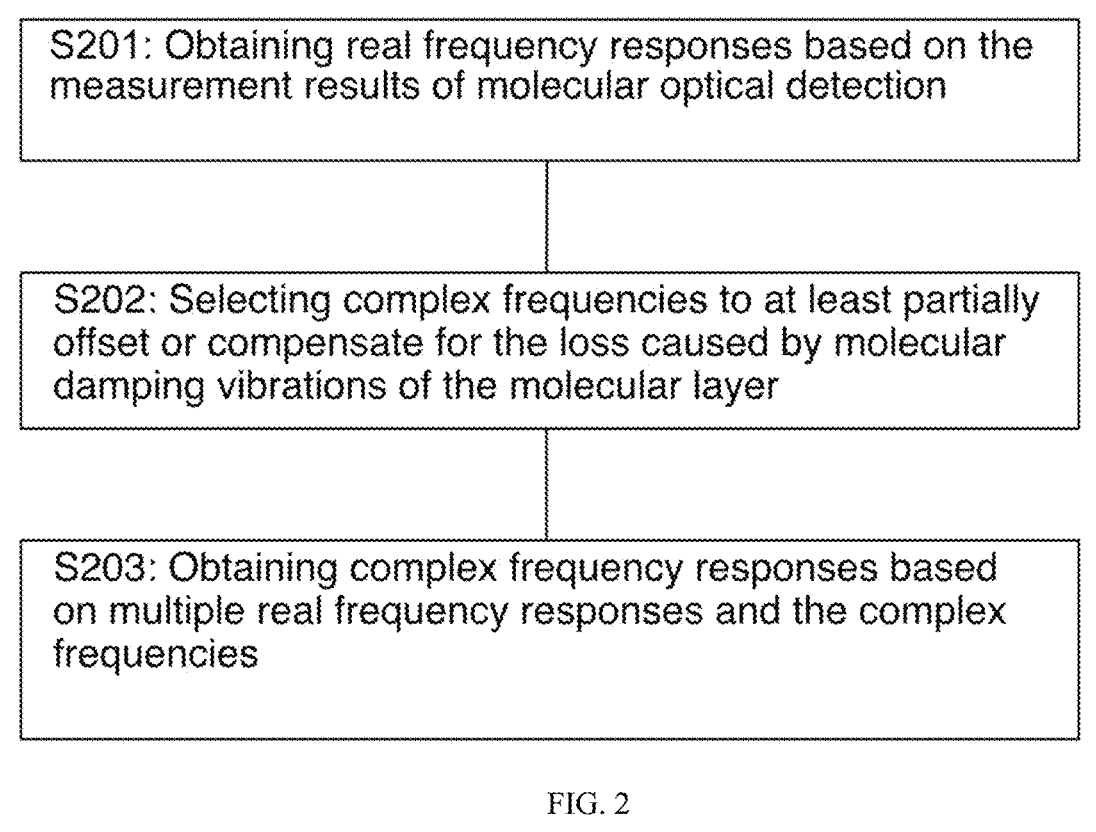

S201: Obtaining real frequency responses based on the measurement results of molecular optical detection S202: Selecting complex frequencies to at least partially offset or compensate for the loss caused by molecular damping vibrations of the molecular layer S203: Obtaining complex frequency responses based on multiple real frequency responses and the complex frequencies

FIG. 2

S301: Constructing real frequency responses and obtaining real frequency responses $P(\omega)$ based on the measurement results $t$, $t_S$ of molecular optical detection.

S302: Selecting complex frequencies to at least partially offset or compensate for the loss caused by molecular damping vibrations of the molecular layer.

S303: Obtaining intermediate complex frequency responses $P(\widetilde{\omega})$ based on multiple real frequency responses $P(\omega)$.

S304: Obtaining complex frequency responses $P(\widetilde{\omega})$ based on the intermediate complex frequency responses $P(\widetilde{\omega})$.

FIG. 3

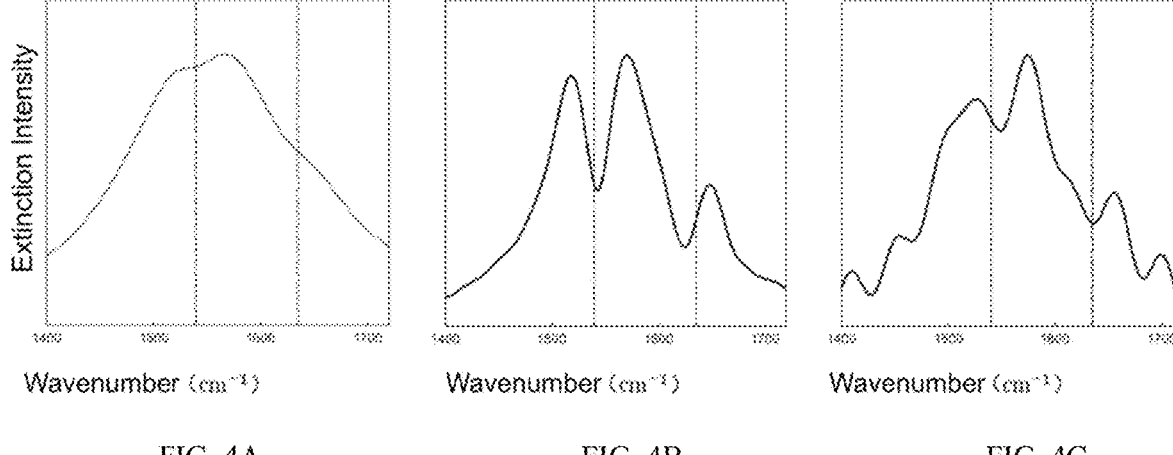

FIG. 4A                         FIG. 4B                         FIG. 4C

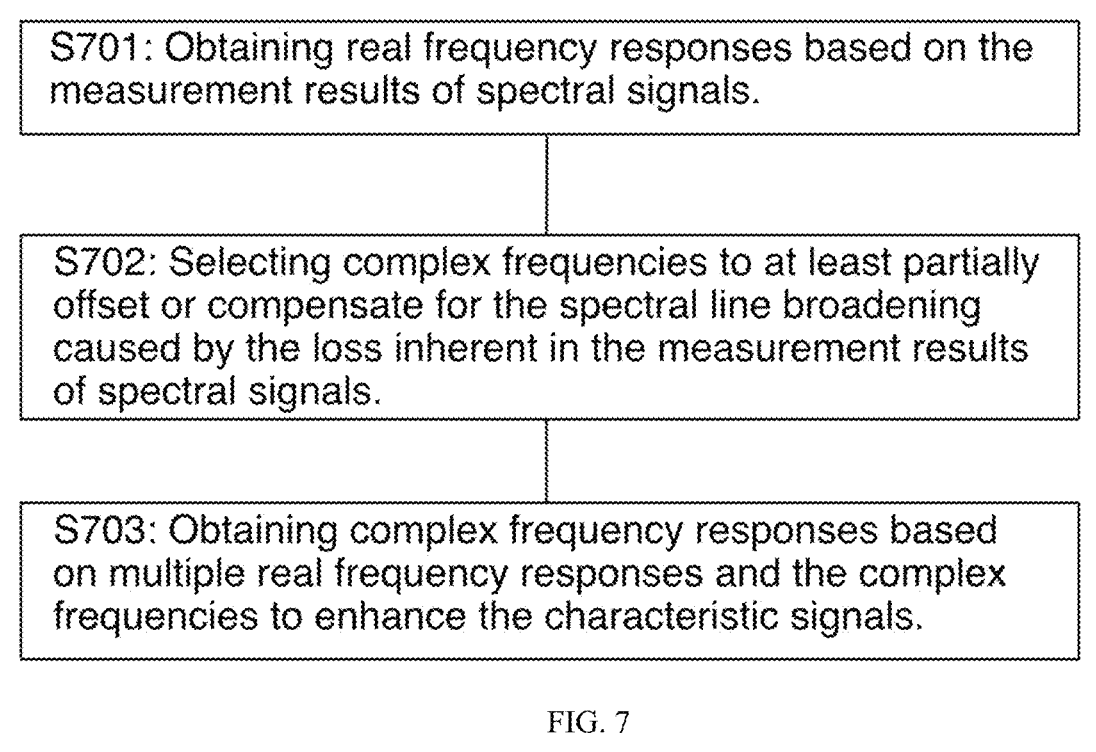

S701: Obtaining real frequency responses based on the measurement results of spectral signals.

S702: Selecting complex frequencies to at least partially offset or compensate for the spectral line broadening caused by the loss inherent in the measurement results of spectral signals.

S703: Obtaining complex frequency responses based on multiple real frequency responses and the complex frequencies to enhance the characteristic signals.

FIG. 7

METHOD FOR ENHANCING CHARACTERISTIC SIGNALS BY SYNTHESIZING MULTIPLE FREQUENCY WAVES

TECHNICAL FIELD OF THE INVENTION

The present invention relates to the field of signal detection, particularly to a method for enhancing characteristic signals by synthesizing multiple frequency waves.

BACKGROUND OF THE INVENTION

Sensors play a crucial role in early disease diagnosis, personalized medicine, and rapid detection of toxic substances, significantly impacting environmental monitoring, food safety, and public health. However, effectively detecting samples with extremely low concentrations of biomolecules remains a major challenge. Surface-enhanced infrared absorption (SEIRA) based on plasmonic nanostructures, especially graphene plasmons, has become an effective method to improve biosensor sensitivity. Although graphene plasmon-based SEIRA offers advantages such as ultra-high sensitivity and active tunability, inherent molecular damping reduces the interaction between vibrational modes and plasmons. As a result, at lower concentrations, the spectra of plasmon-enhanced molecular signals become weaker and broader, ultimately getting masked by noise.

To compensate for molecular damping, one method is to add optical gain materials. However, this requires complex setups and may be incompatible with the detection system. Additionally, gain materials often introduce instability and additional noise. Therefore, there is a need for a simple and effective method to compensate for molecular damping to enhance molecular detection.

SUMMARY OF THE INVENTION

In light of the aforementioned problems in the prior art, the present invention proposes a method for enhancing characteristic signals by synthesizing multiple frequency waves, which includes:

obtaining real frequency responses based on the measurement results of spectral signals;

selecting complex frequencies to at least partially compensate for spectral line broadening caused by losses; and obtaining complex frequency responses based on multiple real frequency responses and the selected complex frequencies to enhance the characteristic signals.

In one embodiment, the step of obtaining complex frequency responses based on multiple real frequency responses and the complex frequencies to enhance the characteristic signals includes calculating the complex frequency response using the following formula:

$$F(\tilde{\omega}) \approx \sum_n \frac{F(\omega_n)\dfrac{1}{i(\tilde{\omega}-\omega_n)}e^{i(\tilde{\omega}-\omega_n)t_0}\Delta\omega}{2\pi}$$

where $F(\omega_n)$ is the real frequency response; $F(\tilde{\omega})$ is the complex frequency response; $\omega_n$ is the frequency of the spectral signal measurement results, n is a positive integer; $\tilde{\omega}$ is the complex frequency; $t_0$ is time; $\Delta\omega$ is the interval frequency of $\omega_n$.

In one embodiment, the measurement results of the spectral signals are based on optical detection of molecules, and the complex frequencies are selected to at least partially compensate for losses caused by molecular damping vibrations of the molecular layer.

In one embodiment, the real frequency response approaches zero as the frequency approaches infinity.

In one embodiment, the method further includes:

constructing real frequency responses such that the real frequency responses approach zero as the frequency approaches infinity before obtaining the real frequency responses based on the measurement results of spectral signals; and obtaining an intermediate complex frequency response based on multiple real frequency responses, and obtaining the complex frequency response based on the intermediate complex frequency response.

In one embodiment, the complex frequency response is the extinction $I(\tilde{\omega})$, and the real frequency response is the intermediate physical quantity $P(\omega)$, $$P(\omega) = i\left(\frac{1}{t_M(\omega)} - 1\right)$$

$$I(\tilde{\omega}) = 1 - \frac{1}{|1 - iP(\tilde{\omega})|^2}$$

where $t_M(\omega)$ is the transmission coefficient, $P(\tilde{\omega})$ is the intermediate complex frequency response.

In one embodiment, the complex frequency $$\tilde{\omega} = \omega - \frac{i\tau}{2},$$

$\omega$ is the current frequency, $\tau$ is the attenuation coefficient, and $\tau$ is greater than zero and selected to make the dielectric constant of the molecular layer a purely real value.

In one embodiment, the real frequency responses include amplitude information and phase information.

In one embodiment, the method further includes:

calculating the phase information based on the amplitude information using the Kramers-Kronig relations.

In one embodiment, the length of time is such that the complex frequency response can enter a quasi-steady-state of complex frequencies.

The present invention also provides a computer-readable storage medium comprising a computer program, wherein the computer program is executable by a processor to perform the steps of the aforementioned method.

The present invention also provides an electronic device, comprising:

one or more processors; and a memory for storing one or more executable instructions;

wherein the one or more processors are configured to execute the one or more executable instructions to perform the steps of the aforementioned method.

The method for enhancing characteristic signals by synthesizing multiple frequency waves according to the present invention can be applied in any field to enhance the characteristic signals of spectral signals. The method for enhancing molecular detection by synthesizing multiple frequency waves according to the present invention can reduce molecular damping and significantly enhance molecular signals at extremely low concentrations by coherently combining multiple real frequency waves to synthesize complex frequency waves. Experiments have shown that synthesizing complex frequency waves can amplify molecular signals up to 15 times at low concentrations, thereby improving the sensitivity of various biosensors and enabling quantitative detection of biomolecules. The method for enhancing molecular detection by synthesizing multiple frequency waves according to the present invention is highly scalable, can facilitate the study of light-matter interactions, and has potential applications in fields such as spectroscopy, sensing, metasurfaces, and optoelectronics.

BRIEF DESCRIPTION OF DRAWINGS

FIG. 2 shows a flowchart of a method for enhancing molecular detection by synthesizing complex frequency waves according to one embodiment of the present invention.

FIG. 3 shows a flowchart of a method for enhancing molecular detection by synthesizing complex frequency waves according to another embodiment of the present invention.

FIG. 4A shows the simulation results of the extinction spectra of a molecular layer based on a graphene sensor in the first example.

FIG. 4B shows the simulation results of the extinction spectra of a molecular layer based on a graphene sensor under complex frequency waves calculated by $P(\omega)$ in the first example.

FIG. 4C shows the simulation results of the extinction spectra of a molecular layer based on a graphene sensor under complex frequency waves calculated by the transmission coefficient $t_M(\omega)$ in the first example.

FIG. 7 shows a flowchart of a method for enhancing characteristic signals by synthesizing complex frequency waves according to one embodiment of the present invention.

DESCRIPTION

To make the objectives, technical solutions, and advantages of the present invention clearer, the invention will be further described in detail below with reference to the drawings and specific embodiments. It should be noted that the embodiments provided by the present invention are only for illustration and do not limit the scope of the invention.

When light passes through a medium, due to the different frequency components, wave components of different frequencies travel different paths. This phenomenon is called dispersion. The classical dispersion theory is a theory that combines Lorentz's classical electron theory and wave optics theory to study the dispersion characteristics when light waves interact with matter. It regards the inside of the medium as an electron and an "atomic nucleus" undergoing damped vibration due to linear elastic force, similar to an oscillating dipole. This oscillating system absorbs or emits electromagnetic waves according to its natural frequency.

Without loss of generality, the Drude-Lorentz dispersion model is used to model the molecular layer, $$\varepsilon(\omega) = 1 + \sum_m \frac{\omega_{pm}^2}{\omega_m^2 - \omega^2 - i\gamma_m\omega} \tag{1}$$

where $\varepsilon(\omega)$ is the dielectric constant of the molecular layer at the incident light frequency $\omega$, which is usually complex. Generally, its imaginary part represents the loss caused by molecular damping vibrations, and its real part represents the refractive index. m is the number of resonance modes of the molecular layer, which is a positive integer. $\omega_m$ is the resonance frequency of the molecular layer under different resonance modes. $\gamma_m$ is the damping rate of the molecular layer under different resonance modes. $\omega_{pm}$ is the plasmon frequency of the molecular layer under different resonance modes.

Figure 1:
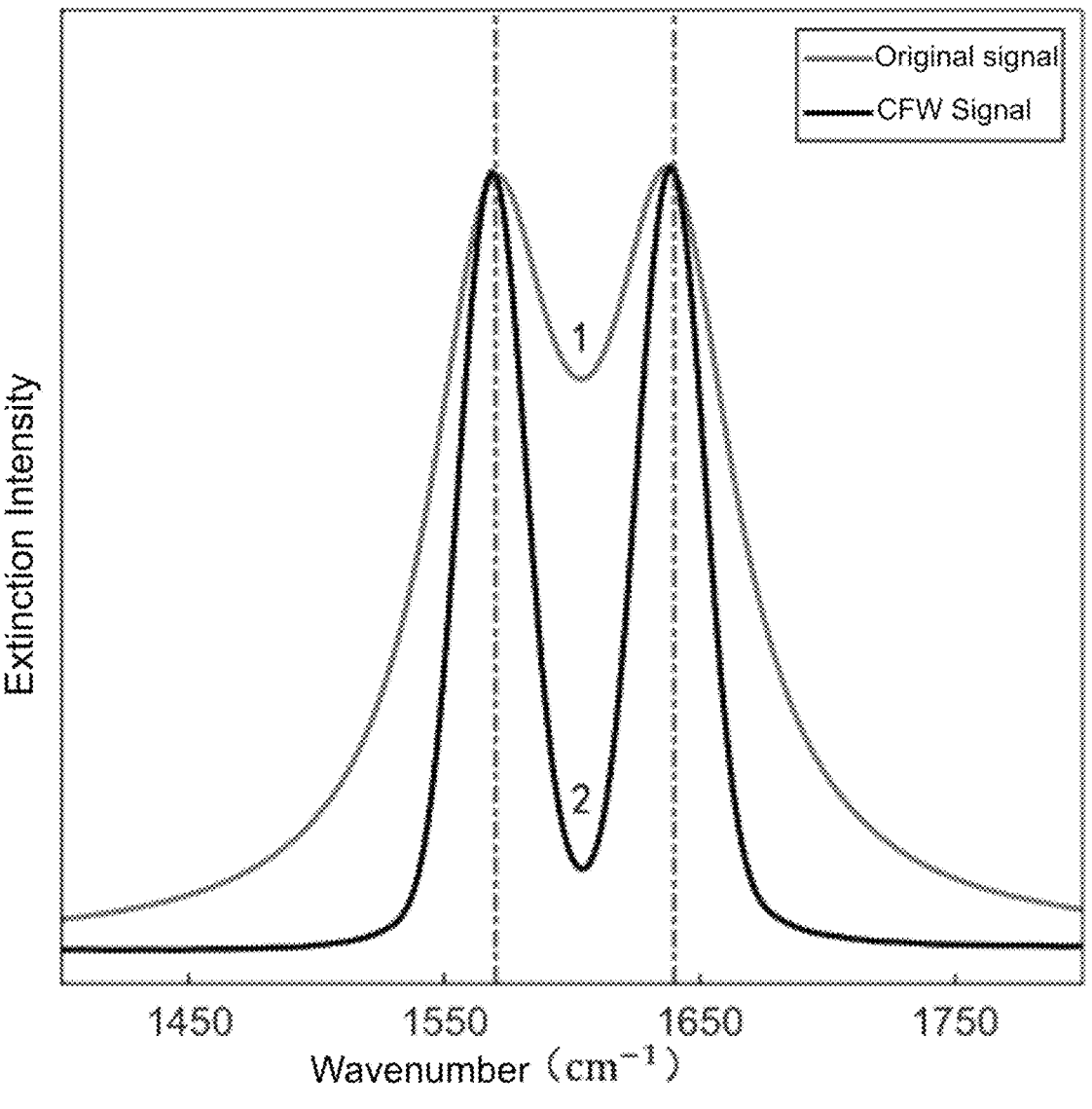
FIG. 1 shows the extinction spectra of a molecular layer under real frequency and complex frequency waves.

For simplicity, suppose the molecular layer has two vibration modes (i.e., m=2), and suppose the plasmon frequencies $\omega_{p1}=\omega_{p2}=128$ cm$^{-1}$, damping rates $\gamma_1=\gamma_2=\gamma_M=60$ cm$^{-1}$, and resonance frequencies $\omega_1=1553$ cm$^{-1}$ and $\omega_2=1666$ cm$^{-1}$. Using finite element (FEM) simulation, the extinction spectrum of the molecular layer is obtained, as shown by curve 1 in FIG. 1, which shows the extinction spectrum of the molecular layer at real frequency. Obviously, the key to making the resonance peaks more pronounced is to reduce the damping rate $\gamma_M$. If the real frequency o in equation (1) is replaced with the complex frequency $$\tilde{\omega} = \omega - \frac{i\gamma_M}{2},$$

then the dielectric constant of the molecular layer becomes purely real, i.e., $$\varepsilon(\tilde{\omega}) = 1 + \frac{\omega_{p1}^2}{\left(\omega_1^2 - \omega^2 - \frac{\gamma_M^2}{4}\right)} + \frac{\omega_{p1}^2}{\left(\omega_2^2 - \omega^2 - \frac{\gamma_M^2}{4}\right)}.$$

This indicates that a complex-frequency wave (CFW) with appropriate time decay can fully compensate for the damping of molecular vibration modes, i.e., it can compensate for the loss caused by molecular damping vibrations.

Ideally, complex-frequency waves are divergent as time approaches negative infinity. Since it is very difficult to directly generate complex-frequency waves, a new method is used to synthesize truncated complex-frequency waves, represented as:

$$E_T(t_0) = E_0 e^{-i\tilde{\omega}t_0}\theta(t_0)$$

where the complex frequency $$\tilde{\omega} = \omega - \frac{i\tau}{2}, \tau > 0$$

is the attenuation coefficient representing the decay rate; $\omega$ is the current frequency; $E_T(t_0)$ is the intensity of the truncated complex-frequency wave; $E_0$ is the initial intensity of the truncated complex-frequency wave (i.e., at time $t_0=0$); and $\theta(t_0)$ is a time truncation function to prevent energy divergence, where for $t_0 \geq 0$, $\theta(t_0)=1$, and for $t_0<0$, $\theta(t_0)=0$.

Based on the Fourier transform, $E_T(t_0)$ can be expanded as an integral of real frequency components:

$$E_T(t_0) = \frac{E_0}{2\pi} \int_{-\infty}^{+\infty} \frac{1}{i(\tilde{\omega} - \omega')} e^{-i\omega' t_0} d\omega'$$

where $$\frac{1}{i(\tilde{\omega} - \omega')}$$

is the Fourier coefficient. Naturally, any response $F(\tilde{\omega})$ (such as the transmitted field, etc.) in a system excited by the truncated complex-frequency wave can be expressed as an integral of quasi-steady-state real frequency responses:

$$F(\tilde{\omega}) \approx \int_{-\infty}^{+\infty} \frac{F(\omega') \dfrac{1}{i(\tilde{\omega} - \omega')} e^{i(\tilde{\omega} - \omega') t_0} d\omega'}{2\pi} \tag{2}$$

where $F(\tilde{\omega})$ is the complex frequency response, which can be any physical quantity linearly responding to the incident light, such as the transmitted field, reflected field, extinction, etc. $\omega_n$ is the incident light frequency of the molecular layer, i.e., the frequency of the measurement results based on molecular optical detection, and $F(\omega_n)$ is the real frequency response obtained from the measurement results of molecular optical detection at real frequency $\omega_n$, including amplitude and phase information, which can be expressed as $Ae^{i\varphi}$, where A is the amplitude and $\varphi$ is the phase. n is a positive integer, and $F(\tilde{\omega})$ can be calculated from the real frequency responses $F(\omega_n)$ that is calculated based on the measurements and/or calculation results of multiple real frequencies $\omega_n$. The phase information in $F(\omega_n)$ can be obtained by measurement or calculation. The discrete frequencies $\omega_1$, $\omega_2$, . . . , $\omega_n$ are equally spaced, with an interval of $\Delta\omega$. Preferably, the time $t_0$ needs to be long enough for the complex-frequency wave to enter a quasi-steady-state, resulting in a narrower final waveform peak width.

The complex frequency $\tilde{\omega}=\omega-i\tau/2$, and the attenuation coefficient $\tau$ is chosen to at least partially offset or compensate for the loss caused by molecular damping vibrations of the molecular layer. Preferably, the attenuation coefficient $\tau$ is chosen to make the dielectric constant of the molecular layer purely real. The real frequency response $F(\omega_n)$ is preferably a physical quantity that approaches zero as the frequency approaches infinity, which reduces the error when the number of discrete frequencies is limited.

Based on the above content, the present invention provides a method for enhancing molecular detection by synthesizing complex frequency waves, which can be used in any system for molecular detection based on optical methods, including but not limited to different optical bands, different optical sensors, and different types of spectra, where the measurement light hits the sample molecules and the transmitted or reflected light is measured to calculate corresponding physical quantities, such as extinction and absorption.

FIG. 2 shows a flowchart of a method for enhancing molecular detection by synthesizing complex frequency waves according to one embodiment of the present invention. The method includes:

Step S201: Obtaining real frequency responses based on the measurement results of molecular optical detection.

The measurement results of molecular optical detection are the optical measurement results after light passes through the molecular layer, which can be, for example, the intensity and/or phase of the reflected and transmitted light after passing through the molecular layer, as well as spectral information. The real frequency response includes amplitude and phase information.

Based on the measurement results of molecular optical detection at multiple incident light frequencies over a period, multiple real frequency responses are obtained.

Step S202: Selecting complex frequencies to at least partially offset or compensate for the loss caused by molecular damping vibrations of the molecular layer.

Step S203: Obtaining complex frequency responses based on multiple real frequency responses and the complex frequencies.

In one embodiment, the complex frequency response can be calculated based on the above formula (2). In another embodiment, the complex frequency response can be calculated based on an integral formula, such as:

$$F(\tilde{\omega}) \approx \int_a^b F(\omega') \frac{1}{i(\tilde{\omega} - \omega')} e^{i(\tilde{\omega} - \omega') t_0} d\omega' / 2\pi$$

where the integral lower limit a is less than the real part of the complex frequency $\tilde{\omega}$, and the integral upper limit b is greater than the real part of the complex frequency $\tilde{\omega}$. Those skilled in the art should understand that the above formula (2) and the above integral formula can be modified or changed to achieve the effect of offsetting or compensating for the loss. Therefore, these modifications or changes are within the scope of the present invention. In other words, any method that obtains complex frequency responses based on the combination of multiple real frequency responses falls within the scope of the present invention.

Below, the method for enhancing molecular detection by synthesizing complex frequency waves is further explained using extinction $I(\tilde{\omega})$ as an example.

Extinction is expressed as $I(\omega)=1-|t_M|^2$, where the transmission coefficient $t_M=t/t_s$, and t and $t_s$ are the transmission coefficients through the substrate with and without the molecular layer, respectively, which are complex numbers and can be obtained by measurement. Theoretically, the real frequency response $t_M(\omega_n)$ can be obtained based on the measurement results t and $t_s$ of molecular optical detection through the above step S201, and then the complex frequency response $t_M(\tilde{\omega})$ can be obtained based on multiple real frequency responses $t_M(\omega_n)$ through the above step S202, and finally, the extinction $I(\tilde{\omega})$ at the complex frequency can be calculated.

However, since the real frequency response $t_M(\omega_n)$ approaches 1 as the frequency approaches infinity, the final error is large, and the enhancement effect of molecular detection is not obvious. Therefore, an intermediate physical quantity is needed, which can be used to calculate the transmission coefficient $t_M(\omega_n)$, and this intermediate physical quantity approaches zero as the frequency approaches infinity.

For thin-layer systems, $t_M$ can be approximated as:

$$t_M(\omega) \approx \frac{1}{1 - iP(\omega)} \qquad (3)$$

where the intermediate physical quantity $$P(\omega) = \frac{\chi_e(\omega)\omega d}{(n_s + 1)c},$$

$n_s$ is the refractive index of the substrate, d is the thickness of the molecular layer, $\chi_e(\omega)$ is the effective polarization rate, and c is the speed of light. Considering the difficulty of phase measurement in practical applications, the phase information can be calculated based on the amplitude information through the Kramers-Kronig (K-K) relation. That is, the phase $\arg(t_M)$ can be calculated from the amplitude $|t_M|$ of the transmission coefficient. The Kramers-Kronig relation is given by:

$$\arg(t_M(\omega)) = -\frac{1}{\pi}\mathcal{P}\int_{\mathbb{R}} \frac{\ln|t_M(\omega)|}{\omega - \omega'}d\omega' \qquad (4)$$

where $\mathcal{P}$ is the Cauchy principal value integral, and $\mathbb{R}$ is the real number domain.

Using equation (3), $P(\omega)$ can be derived from the transmission coefficient $t_M$:

$$P(\omega) = \left(\frac{1}{t_M(\omega)} - 1\right) \qquad (5)$$

It should be noted that, similar to equation (2), equation (4) can also be discretized in practical calculations. $P(\omega)$ approaches zero as the frequency approaches infinity. Therefore, the extinction $I(\tilde{\omega})$ at complex frequencies can be obtained by calculating the response $P(\tilde{\omega})$ from $P(\omega)$:

$$P(\tilde{\omega}) \approx \sum_n P(\omega_n)\frac{1}{i(\tilde{\omega} - \omega_n)}e^{i(\tilde{\omega} - \omega_n)t_0}\Delta\omega/2\pi \qquad (6)$$

$$I(\tilde{\omega}) = 1 - \frac{1}{|1 - iP(\tilde{\omega})|^2} \qquad (7)$$

Accordingly, the enhancement effect of complex-frequency waves can be demonstrated by setting $\tilde{\omega} = \omega - i\gamma_M/2$. Referring again to FIG. 1, curve 2 in FIG. 1 shows the extinction spectrum of the molecular layer at complex frequencies. Compared with the original signal $I(\omega)$ shown by curve 1, the resonance peak of the complex frequency response $I(\tilde{\omega})$ shown by curve 2 is significantly narrower, indicating that synthesizing complex-frequency waves can directly enhance molecular vibration fingerprints without additional assistance.

Based on the above derivation, the present invention provides a method for enhancing molecular detection by synthesizing complex-frequency waves. FIG. 3 shows a flowchart of a method for enhancing molecular detection in extinction by synthesizing complex-frequency waves according to another embodiment of the present invention. The method includes:

Step S301: Constructing real frequency responses and obtaining real frequency responses $P(\omega)$ based on the measurement results t, $t_s$ of molecular optical detection. Specifically, constructing real frequency responses $P(\omega)$ based on the complex frequency response $I(\omega)$, such that the real frequency response approaches zero as the frequency approaches infinity, where $$P(\omega) = i\left(\frac{1}{t_M(\omega)} - 1\right).$$

Based on the measurement results of molecular optical detection at multiple incident light frequencies over a period, multiple real frequency responses are obtained.

Step S302: Selecting complex frequencies to at least partially offset or compensate for the loss caused by molecular damping vibrations of the molecular layer.

Step S303: Obtaining intermediate complex frequency responses $P(\tilde{\omega})$ based on multiple real frequency responses $P(\omega)$.

Step S304: Obtaining complex frequency responses $I(\tilde{\omega})$ based on the intermediate complex frequency responses $P(\tilde{\omega})$.

Below, the extinction spectrum of the molecular layer is simulated using a graphene sensor as an example. In the first example, the positions of the two characteristic peaks of the molecular layer used for simulation are $1540\ cm^{-1}$ and $1635\ cm^{-1}$; in the second example, the positions of the two characteristic peaks of the molecular layer used for simulation are $1570\ cm^{-1}$ and $1620\ cm^{-1}$.

FIG. 4A shows the simulation results of the extinction spectrum of the molecular layer based on a graphene sensor in the first example, FIG. 4B shows the simulation results of the extinction of the molecular layer based on a graphene sensor under complex-frequency waves calculated by $P(\omega)$ in the first example, and FIG. 4C shows the simulation results of the extinction of the molecular layer based on a graphene sensor under complex-frequency waves calculated by the transmission coefficient $t_M(\omega)$ in the first example. The positions of the two characteristic peaks of the molecular layer used for simulation are $1540\ cm^{-1}$ and $1635\ cm^{-1}$ (dashed line positions). As shown in FIGS. 4A and 4B, synthesizing complex-frequency waves can directly enhance molecular vibration fingerprints. As shown in FIGS. 4B and 4C, the extinction spectrum under complex-frequency waves calculated by $P(\omega)$ shows deeper dips and more pronounced signals.

Figures 5A, 5B, 5C, 6:
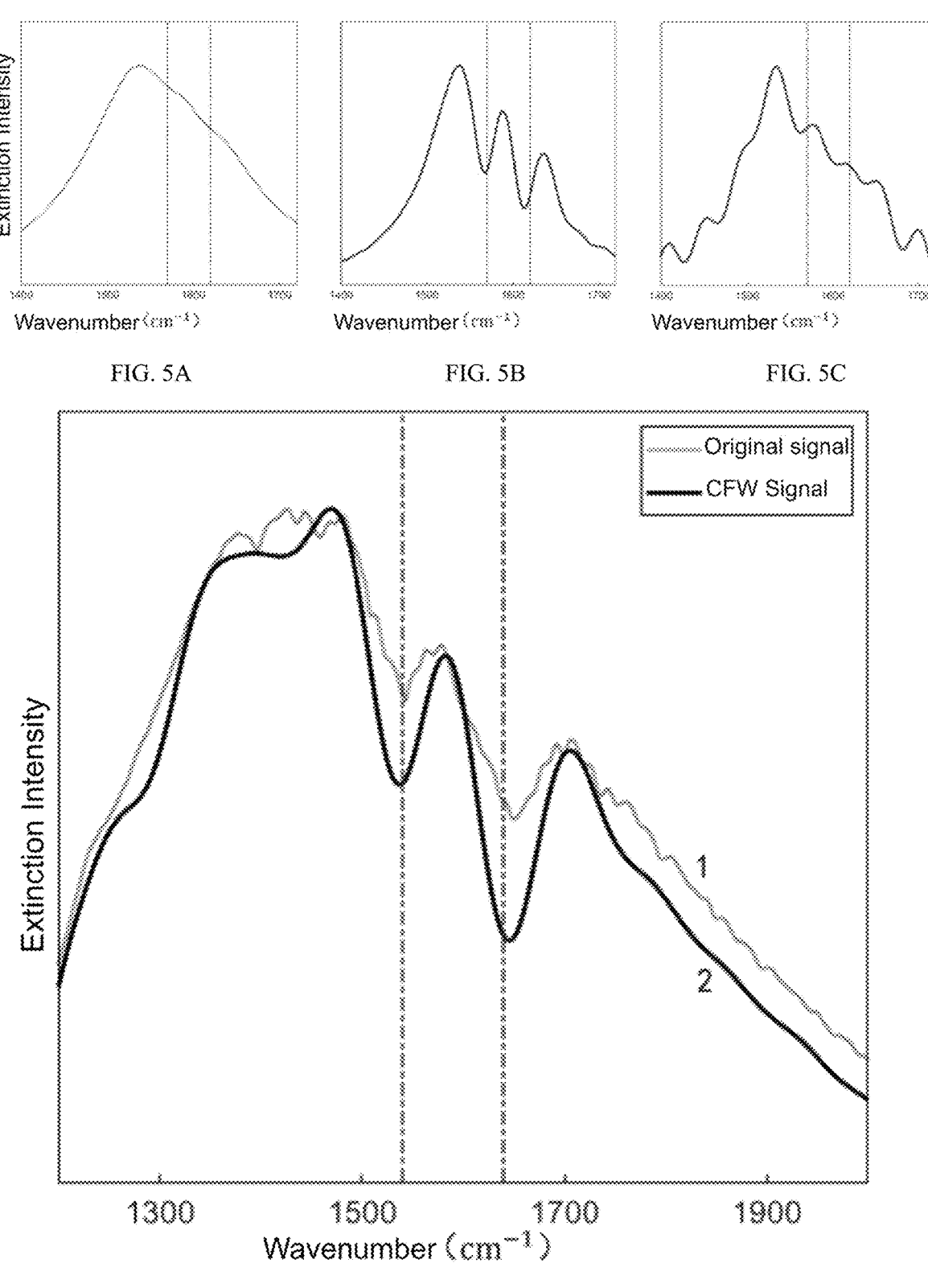
FIG. 5A shows the simulation results of the extinction spectra of a molecular layer based on a graphene sensor in the second example.
FIG. 5B shows the simulation results of the extinction spectra of a molecular layer based on a graphene sensor under complex frequency waves calculated by $P(\omega)$ in the second example.
FIG. 5C shows the simulation results of the extinction spectra of a molecular layer based on a graphene sensor under complex frequency waves calculated by the transmission coefficient $t_M(\omega)$ in the second example.
FIG. 6 shows the experimental results of the extinction spectra of a molecular layer based on a graphene sensor.

FIG. 5A shows the simulation results of the extinction spectrum of the molecular layer based on a graphene sensor in the second example, FIG. 5B shows the simulation results of the extinction of the molecular layer based on a graphene sensor under complex-frequency waves calculated by $P(\omega)$ in the second example, and FIG. 5C shows the simulation results of the extinction of the molecular layer based on a graphene sensor under complex-frequency waves calculated by the transmission coefficient $t_M(\omega)$ in the second example. The positions of the two characteristic peaks of the molecular layer used for simulation are $1570\ cm^{-1}$ and $1620\ cm^{-1}$. As shown in FIGS. 5A and 5B, synthesizing complex-frequency waves can directly enhance molecular vibration fingerprints. As shown in FIGS. 5B and 5C, the extinction spectrum under complex-frequency waves calculated by $P(\omega)$ shows deeper dips and more pronounced signals.

Therefore, in practical applications, the real frequency response $F(\omega_n)$ should be chosen as a physical quantity that approaches zero as the frequency approaches infinity to further enhance the results of molecular detection.

FIG. 6 shows the experimental results of the extinction spectrum of a silk fibroin molecular layer based on a graphene sensor. The positions of the two characteristic peaks of the silk fibroin molecular layer are 1540 cm$^{-1}$ and 1635 cm$^{-1}$ (dashed line positions). Curve 1 is the extinction spectrum of the silk fibroin molecular layer at real frequency, and curve 2 is the extinction spectrum of the silk fibroin molecular layer at complex frequency. Compared with the original signal shown by curve 1, the resonance peak of the complex frequency response $I(\omega)$ shown by curve 2 is significantly narrower, experimentally demonstrating that synthesizing complex-frequency waves can directly enhance molecular vibration fingerprints.

Although extinction is used as an example in the above embodiments, the present invention is not limited to this. The complex frequency response of the present invention can be any physical quantity directly or indirectly calculated based on the measurement results of molecular optical detection.

In the above embodiments, molecular optical detection is used as an example for detailed description, but those skilled in the art should understand that the method for enhancing characteristic signals by synthesizing complex-frequency waves can be applied to any field of spectral signals, including but not limited to spectroscopy, electron energy loss spectroscopy, angle-resolved photoelectron spectroscopy, mechanical characteristic spectroscopy, and acoustic spectroscopy.

FIG. 7 shows a flowchart of a method for enhancing characteristic signals by synthesizing complex-frequency waves according to one embodiment of the present invention. The method includes:

Step S701: Obtaining real frequency responses based on the measurement results of spectral signals. Based on the measurement results of spectral signals at multiple frequencies over a period, multiple real frequency responses are obtained.

Step S702: Selecting complex frequencies to at least partially offset or compensate for the spectral line broadening caused by the loss inherent in the measurement results of spectral signals.

Step S703: Obtaining complex frequency responses based on multiple real frequency responses and the complex frequencies to enhance the characteristic signals.

Specifically, the complex frequency response can be calculated based on the above formula (2)

$$F(\tilde{\omega}) \approx \sum_n F(\omega_n) \frac{1}{i(\tilde{\omega} - \omega_n)} e^{i(\tilde{\omega} - \omega_n)t_0} \Delta\omega/2\pi,$$

where $F(\tilde{\omega})$ is the complex frequency response. $\omega_n$ is the frequency of the measurement results of spectral signals, and $F(\omega_n)$ is the real frequency response. The complex frequency $\tilde{\omega} = \omega - i\tau/2$, and the attenuation coefficient $\tau$ is chosen to at least partially offset or compensate for the spectral line broadening caused by the loss inherent in the measurement results of spectral signals.

In embodiments where the horizontal coordinate is not frequency, the horizontal coordinate of the measurement results of spectral signals can be used as their virtual frequency $\omega_n$, and the virtual phase information of spectral signals can be obtained based on the amplitude information (i.e., the vertical coordinate) of spectral signals through the Kramers-Kronig relation. Those skilled in the art should understand that although virtual frequency and virtual phase do not have actual physical meaning, they can be used for mathematical calculations.

For ease of understanding, in the present invention, frequency includes actual frequency and virtual frequency used for mathematical calculations, and phase includes actual phase and virtual phase used for mathematical calculations.

The method for enhancing characteristic signals by synthesizing complex-frequency waves according to the present invention can be applied in any field to enhance the characteristic signals of spectral signals, which can be, for example, dip signals, peak signals, etc.

The method for enhancing molecular detection by synthesizing complex-frequency waves according to the present invention. By coherently combining multiple real frequency waves into complex-frequency waves, molecular damping can be reduced, significantly enhancing molecular signals at extremely low concentrations. Experiments have shown that synthesizing CFW can amplify molecular signals up to 15 times at low concentrations, thereby improving the sensitivity of various biosensors and enabling quantitative detection of biomolecules. The method for enhancing molecular detection by synthesizing complex-frequency waves according to the present invention is highly scalable, can promote the study of light-matter interactions, and has potential applications in the fields of spectroscopy, sensing, metasurfaces, optical waveguides, and logic devices.

Although the present invention has been described through preferred embodiments, it is not limited to the described embodiments. Various changes and modifications made without departing from the scope of the present invention are included.

The invention claimed is:

1. A method for enhancing characteristic signals by synthesizing multiple frequency waves, comprising:

obtaining a real frequency response based on a measurement result of a spectral signal;
   selecting a complex frequency to at least partially compensate for spectral line broadening caused by losses; and
   obtaining a complex frequency response based on the real frequency response and the selected complex frequency to enhance the characteristic signals.

2. The method for enhancing characteristic signals by synthesizing multiple frequency waves according to claim 1, wherein the step of obtaining the complex frequency response based on the real frequency response and the complex frequency to enhance the characteristic signals includes calculating the complex frequency response using following formula:

$$F(\tilde{\omega}) \approx \sum_n \frac{F(\omega_n) \frac{1}{i(\tilde{\omega} - \omega_n)} e^{i(\tilde{\omega} - \omega_n)t_0} \Delta\omega}{2\pi}$$

where $F(\omega_n)$ is the real frequency response; $F(\tilde{\omega})$ is the complex frequency response; $\omega_n$ is the frequency of the measurement result of the spectral signal, n is a positive integer; $\tilde{\omega}$ is the complex frequency; $t_0$ is time; $\Delta\omega$ is an interval frequency of $\omega_n$.

3. The method for enhancing characteristic signals by synthesizing multiple frequency waves according to claim 1, wherein the measurement result of the spectral signal is based on a measurement result of optical detection of molecules, and the complex frequency is selected to at least partially compensate for losses caused by molecular damping vibrations of a molecular layer.

4. The method for enhancing characteristic signals by synthesizing multiple frequency waves according to claim 3, wherein the real frequency response approaches zero as the frequency approaches infinity.

5. The method for enhancing characteristic signals by synthesizing multiple frequency waves according to claim 3, further comprising:

constructing the real frequency response such that the real frequency response approach zero as the frequency approaches infinity before obtaining the real frequency response based on the measurement result of spectral signal, wherein obtaining the complex frequency response based on the real frequency response and the selected complex frequency to enhance the characteristic signals comprises:

obtaining an intermediate complex frequency response based on the real frequency response, and obtaining the complex frequency response based on the intermediate complex frequency response.

6. The method for enhancing characteristic signals by synthesizing multiple frequency waves according to claim 5, wherein the complex frequency response is an extinction $I(\tilde{\omega})$, and the real frequency response is an intermediate physical quantity $P(\omega)$, $$P(\omega) = i\left(\frac{1}{t_M(\omega)} - 1\right)$$

$$I(\tilde{\omega}) = 1 - \frac{1}{|1 - iP(\tilde{\omega})|^2}$$

where $t_M(\omega)$ is a transmission coefficient, and $P(\tilde{\omega})$ is the intermediate complex frequency response.

7. The method for enhancing characteristic signals by synthesizing multiple frequency waves according to claim 3, wherein the complex frequency is $$\tilde{\omega} = \omega - \frac{i\tau}{2},$$

where $\omega$ is a current frequency, $\tau$ is an attenuation coefficient, and $\tau$ is greater than zero and selected to make a dielectric constant of the molecular layer a purely real value.

8. The method for enhancing characteristic signals by synthesizing multiple frequency waves according to claim 3, wherein the real frequency responses include amplitude information and phase information.

9. The method for enhancing characteristic signals by synthesizing multiple frequency waves according to claim 8, further comprising:

calculating the phase information based on the amplitude information using the Kramers-Kronig relations.

10. The method for enhancing characteristic signals by synthesizing multiple frequency waves according to claim 2, wherein a length of time to is such that the complex frequency response can enter a quasi-steady-state of complex frequencies.

11. A computer-readable storage medium comprising a computer program or software, wherein the computer program is executable by a processor to perform the steps of claim 1.

12. An electronic device comprising:

one or more processors; and a memory for storing one or more executable instructions;

wherein the one or more processors are configured to execute the one or more executable instructions to perform the steps of claim 1.

\* \* \* \* \*